(12) United States Patent
Volokhine

(10) Patent No.: US 9,948,249 B2
(45) Date of Patent: Apr. 17, 2018

(54) INTEGRATED MATCHING CIRCUIT FOR A HIGH FREQUENCY AMPLIFIER

(71) Applicant: Youri Volokhine, Plaisance du Touch (FR)

(72) Inventor: Youri Volokhine, Plaisance du Touch (FR)

(73) Assignee: NXP USA, INC., Austin, TX (US)

(*) Notice: Subject to any disclaimer, the term of this patent is extended or adjusted under 35 U.S.C. 154(b) by 141 days.

(21) Appl. No.: 14/898,387

(22) PCT Filed: Jun. 27, 2013

(86) PCT No.: PCT/IB2013/001608
§ 371 (c)(1),
(2) Date: Dec. 14, 2015

(87) PCT Pub. No.: WO2014/207499
PCT Pub. Date: Dec. 31, 2014

(65) Prior Publication Data
US 2016/0142025 A1 May 19, 2016

(51) Int. Cl.
*H03F 1/56* (2006.01)
*H03F 3/193* (2006.01)
(Continued)

(52) U.S. Cl.
CPC ............ *H03F 1/565* (2013.01); *H01L 23/66* (2013.01); *H01L 24/49* (2013.01); *H03F 1/0205* (2013.01);
(Continued)

(58) Field of Classification Search
CPC ........ H03F 1/565; H03F 1/0205; H03F 3/193; H03F 3/195; H03F 3/211; H01L 23/66; H01L 24/49
(Continued)

(56) References Cited

U.S. PATENT DOCUMENTS 7,119,623 B2  10/2006  Blednov et al.
7,378,920 B2   5/2008  Jones et al.
(Continued)

FOREIGN PATENT DOCUMENTS

JP        2001094361        4/2001

OTHER PUBLICATIONS

International Search Report and Written Opinion correlating to PCT/IB2013/016008 dated Mar. 27, 2014.

*Primary Examiner* — Stephen E Jones
*Assistant Examiner* — Scott S Outten

(57) ABSTRACT

An integrated matching circuits for a high frequency amplifier transistor having an input terminal, an output terminal and a reference terminal. The reference terminal is coupled to a reference potential. The integrated matching circuit comprises an inductive element, and a capacitive element arranged in a series arrangement with the inductive element. The series arrangement has a first terminal end connected to the input terminal or to the output terminal and a second terminal end connected to the reference terminal. The first terminal end and the second terminal end are arranged at a same lateral side of the integrated matching circuit to obtain a geometry with the first terminal end adjacent to the input terminal or to the output terminal and the second terminal end adjacent to the reference terminal.

16 Claims, 6 Drawing Sheets

(51) Int. Cl.
 *H03F 3/21* (2006.01)
 *H03F 1/02* (2006.01)
 *H03F 3/195* (2006.01)
 *H01L 23/66* (2006.01)
 *H01L 23/00* (2006.01)

(52) U.S. Cl.
 CPC ............ *H03F 3/193* (2013.01); *H03F 3/195* (2013.01); *H03F 3/211* (2013.01); *H01L 24/48* (2013.01); *H01L 2223/6611* (2013.01); *H01L 2223/6655* (2013.01); *H01L 2224/4813* (2013.01); *H01L 2224/49175* (2013.01); *H01L 2924/00014* (2013.01); *H03F 2200/387* (2013.01); *H03F 2200/451* (2013.01); *H03F 2203/21103* (2013.01)

(58) Field of Classification Search
 USPC ...................................... 333/32; 330/32, 307
 See application file for complete search history.

(56) References Cited

U.S. PATENT DOCUMENTS

| | | | |
|---|---|---|---|
| 7,936,045 | B2 | 5/2011 | Bakalski et al. |
| 2007/0139117 | A1 | 6/2007 | Iida |
| 2010/0090767 | A1* | 4/2010 | Ohnishi ................ H03F 1/0272 330/277 |
| 2011/0109391 | A1 | 5/2011 | Wilson |
| 2012/0098598 | A1 | 4/2012 | Uno et al. |
| 2012/0169423 | A1 | 7/2012 | Kamiyama et al. |
| 2012/0294387 | A1* | 11/2012 | Ghannouchi ......... H03F 1/0288 375/295 |
| 2013/0207732 | A1* | 8/2013 | Cabanillas .............. H03F 1/347 330/307 |

\* cited by examiner

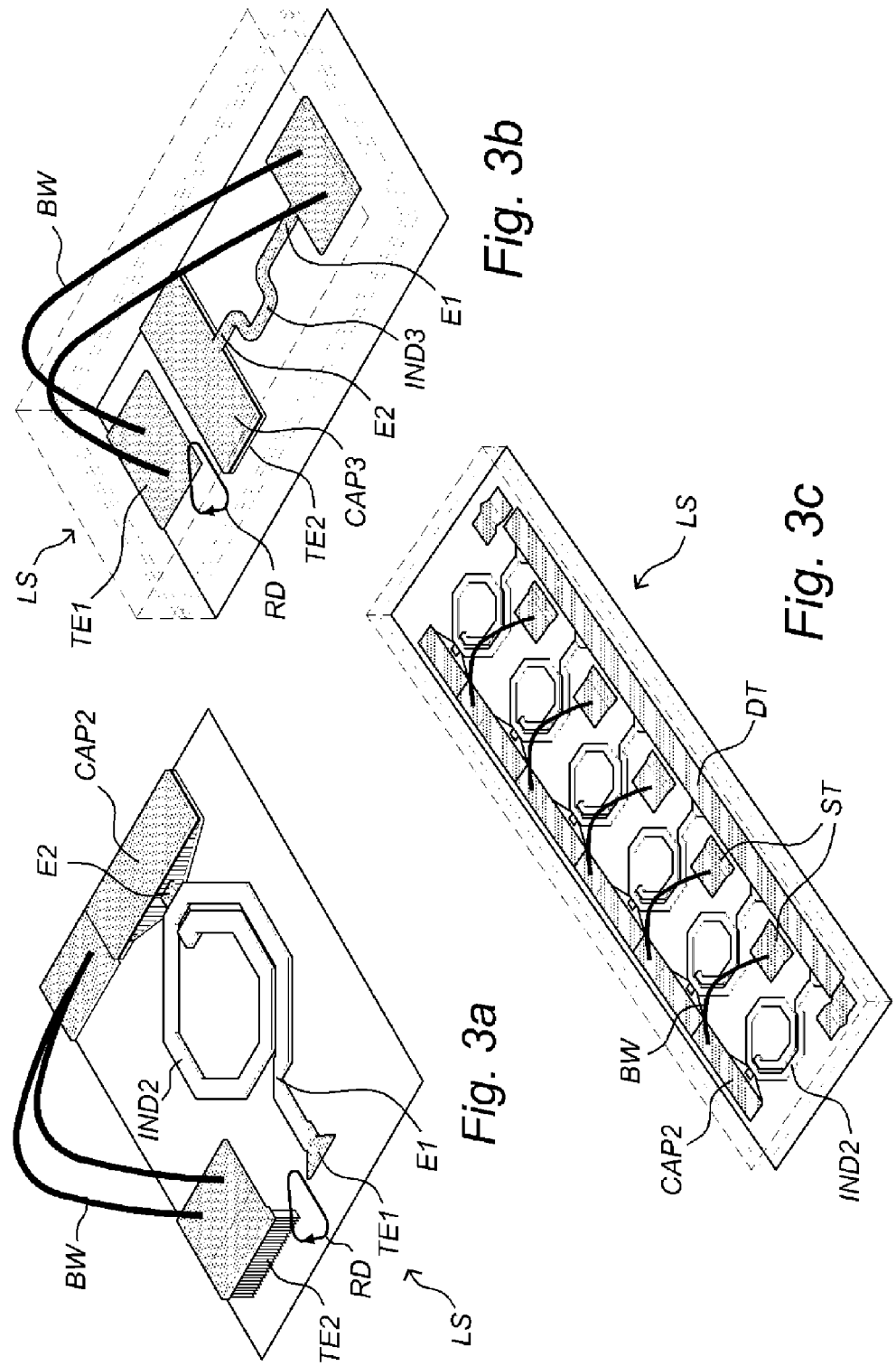

INTEGRATED MATCHING CIRCUIT FOR A HIGH FREQUENCY AMPLIFIER

FIELD OF THE INVENTION

This invention relates to an integrated matching circuit for a high frequency amplifier and in particular to a high frequency amplifier using the integrated matching circuit. The invention further relates to a semiconductor device and to a base station for mobile communications comprising the high frequency amplifier.

BACKGROUND OF THE INVENTION

High frequency amplifiers are devices that amplify a high frequency signal and transfer the high frequency signal to a load termination. In high frequency power amplifiers the transfer of the high frequency signal is typically done in successive power amplifier stages, wherein each of the successive power amplifier stages has gradually a larger power capability than a preceding power amplifier stage. The transfer of the high frequency signal through each one of the successive power amplifier stages to the load termination must be carefully designed in order not to attenuate part of the high frequency signal, thereby degrading the high frequency power amplifier performance. Optimization of the transfer of the high frequency signal is achieved by impedance matching. Impedance matching matches a source impedance to a load impedance ensuring maximum transfer of power from the source impedance to the load impedance. Impedance matching is sometimes realized with discrete passive components that offer predetermined high frequency characteristics. Impedance matching is typically performed by impedance matching circuits. An example of impedance matching circuits used in high frequency amplifiers is shown on FIG. 1 of U.S. Pat. No. 7,119,623 B2. A similar figure is shown in FIG. 1a of this document. FIG. 1a shows a MOS device 10 with a gate terminal G, a source terminal S and a drain terminal D and an output capacitance Cout. The output capacitance Cout is a parasitic output capacitance which has a negative effect on the performance of the MOS device 10 by adding a frequency-dependent component to the MOS device's 10 output impedance. The MOS device 10 of FIG. 1a is connected in a common source configuration, that is with the source terminal S connected to a reference potential common to the gate terminal G and to the drain terminal D. The gate terminal G and the drain terminal D are respectively an input and an output for the MOS device 10. The reference potential is a ground reference potential GND. A parasitic inductive path 15 is present between the source terminal S and the ground reference potential GND. The parasitic inductive path 15 may be caused by the presence of a physical distance between the actual source terminal S and the effective location of the ground reference potential GND. An impedance matching circuit is connected to the drain terminal D of the MOS device 10. The impedance matching circuit shown in FIG. 1a includes a shunt inductor L in series with a shunt capacitor C and a series inductor INDS connected between the drain terminal D of the MOS device 10 and a signal output terminal Output. The shunt capacitor C is coupled at one side to a reference potential GNDM which may differ from the ground reference potential GND (e.g. at a different location). The shunt inductor L provides a parallel resonant circuit together with the output capacitance Cout during operation at the high frequency of interest. The output capacitance Cout is therefore effectively compensated by the shunt inductor L. The shunt inductor L is coupled to the reference potential GNDM through the large shunt capacitor C to prevent a DC current through the shunt inductor L to flow to the reference potential GNDM. The parasitic inductive path 15 hampers a proper function of the MOS device 10 during operation at high frequency because it provides an undesired feedback for the high frequency signal from output to input. Further to that, a distance d is present between the two different physical distant points of the reference potential GNDM at which the impedance matching circuit and the MOS device 10 are both connected. The distance d may increase a value of the parasitic inductive path 15. The increase of the value of the parasitic inductive path 15 may increase an influence of the return current 20 flowing from the output of the MOS device 10 to the input of the MOS device 10 passing through the increased parasitic inductive path 15. This return current 20 is depicted in FIG. 1a with a dashed arrow line pointing to the source terminal S of the MOS device 10. One of the problems generated by this increased influence of the return current 20 is for example that stability and gain of the MOS device 10 may be compromised.

SUMMARY OF THE INVENTION

The present invention provides an integrated matching circuit for a high frequency amplifier transistor and a high frequency amplifier using such integrated matching circuit as is described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

FIG. 3a shows a further example of a practical layout embodiment of an impedance matching circuit according to the invention, FIG. 3b shows a further example of a practical layout embodiment of an impedance matching circuit according to the invention, FIG. 3c shows an example of the practical layout embodiment of FIG. 3a implemented in a high frequency power amplifier.

Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1A:
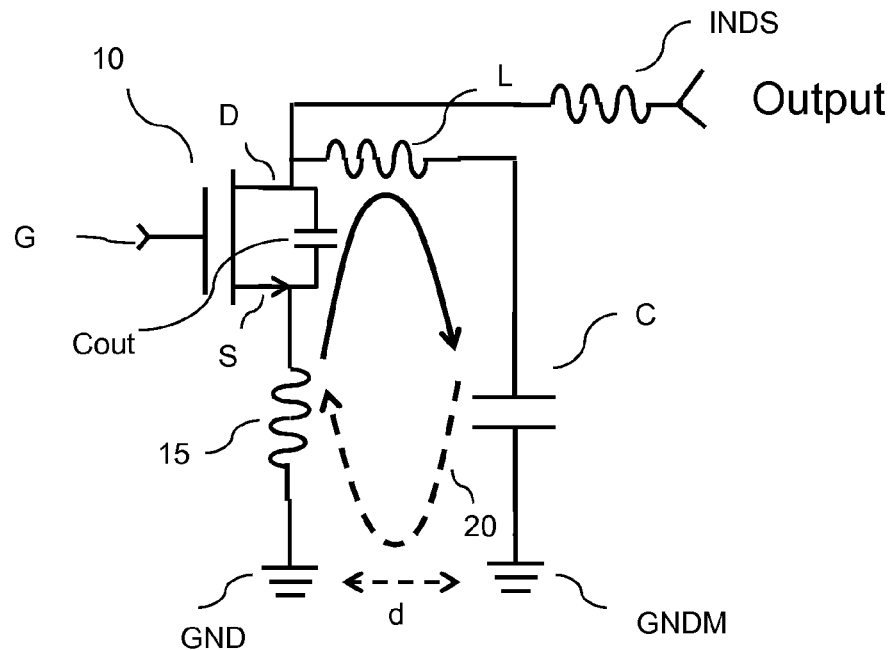
FIG. 1a schematically shows a prior art example of an impedance matching circuit used in a MOS amplifier.
Figure 1B:
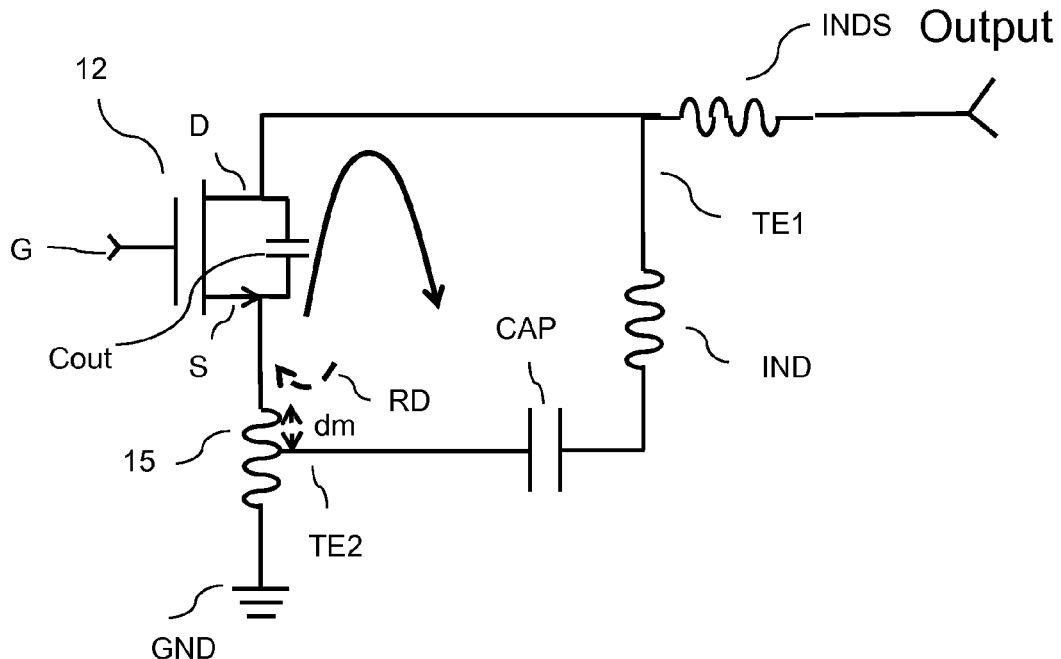
FIG. 1b shows a schematic representation of an impedance matching circuit that minimizes the influence of the return current flow according to the invention.

FIG. 1b shows a schematic representation of an integrated impedance matching circuit used in a high frequency amplifier transistor 10. The high frequency amplifier transistor 10 is a MOS device and may be for example a final stage or an intermediate stage of a high frequency power amplifier. Alternatively the high frequency amplifier transistor 12 may be for example a hetero-junction bipolar transistor (HBJT) or a metal-semiconductor field effect transistor (MESFET). The high frequency amplifier transistor 12 has three terminals: an input terminal G, an output terminal D and a reference terminal S. The input terminal G, the output terminal D and the reference terminal S are respectively a gate terminal, a drain terminal and a source terminal of the high frequency amplifier transistor 12. The reference terminal S is coupled to a reference potential GND via a parasitic inductive path 15. The reference potential GND is typically a lowest available potential for the high frequency amplifier transistor 12, which is normally a ground or earth potential. The high frequency amplifier transistor 12 is configured in a common source configuration in which the reference terminal S is a common reference to the input terminal G and to the output terminal D. The parasitic inductive path 15 represents typically an undesired but unavoidable extra component in the common source configuration of the high frequency amplifier transistor 12. In fact there always exist a physical distance between the reference terminal S and the reference potential GND. This physical distance may for example include a path going through different semiconductor materials of different resistivity. This path traversing different semiconductor materials shows typically a frequency-dependent resistance, i.e. a reactance, similar to a reactance of an inductor. At the high frequency on which the high frequency amplifier transistor 12 operates, which may be in the radio or microwave frequency range, i.e. in the order of several hundreds of megahertz (MHz) to a few gigahertz (GHz), the parasitic inductive path 15 may have a considerable inductive reactance which is not negligible. Therefore, in the present invention, the parasitic inductive path 15 is taken into account in the geometrical design of the high frequency power amplifier. The impedance matching circuit shown in FIG. 1b includes a series arrangement of an inductive element IND and capacitive element CAP. The series arrangement has a first terminal end TE1 and a second terminal end TE2. The first terminal end TE1 is connected to the output terminal D, the second terminal end TE2 is arranged to physically tap a portion of the parasitic inductive path 15. The second terminal end TE2 is connected to the reference terminal S. As it will be shown in some practical layout embodiments the second terminal end TE2 taps in reality the parasitic inductive path 15 at a point such that a distance dm between the second terminal end TE2 and the reference terminal S is minimized. As mentioned in the introduction, the current circulating from the output terminal D to the reference terminal S creates a feedback return path for the high frequency amplifier transistor 12 along which a return current RD flows. By minimizing the distance dm, only a portion of the parasitic inductive path 15 is involved in this feedback return path. Furthermore, as it will be better described in several practical layout implementations of the invention, the first terminal end TE1 and the second terminal end TE2 are arranged at a same lateral side LS of the impedance matching circuit to obtain a geometry in which the first terminal end TE1 is adjacent to the output terminal D and the second terminal end TE2 is adjacent to the reference terminal S. It should be noted here that the word adjacent means that there are no extra parasitic inductive conductive paths between the first terminal end TE1 and the output terminal D and between the second terminal end TE2 and the reference terminal S. In other words, a path starting at the output terminal D and ending at the reference terminal S passing by the series arrangement of the inductive element IND with the capacitive element CAP should only contain the inductive element IND in series with the capacitive element CAP and no other extra parasitic elements. This arrangement ensures that the influence on the unwanted feedback of the return current RD flowing from the output terminal D to the reference terminal S is minimized. In the practical layout implementations of the invention, the first terminal end TE1 and second terminal end TE2 are arranged in close proximity to each other. The distance dm creates a parasitic inductive path common to the output terminal D and the reference terminal S used by the return current RD to generate an undesired output to input feedback. The generated undesired output to input feedback with the solution provided in FIG. 1b is effectively smaller than an undesired output to input feedback generated by the prior art solution of FIG. 1a. In FIG. 1a the return current 20 must flow from the output terminal D to the reference terminal S via the entire parasitic inductive path 15 and via a further parasitic inductive path determined by a distance d between a reference potential GNDM of the impedance matching circuit and a ground reference potential GND of the MOS device 12. Since the total parasitic inductive path from output to input shown in FIG. 1a is larger than the total parasitic inductive path from output to input shown in FIG. 1b, the influence of the return current 20 shown in FIG. 1a on the output to input feedback is also larger than the influence of the return current RD shown in FIG. 1b. The total parasitic inductive path acts as a current to voltage converter for the output to input feedback. When the total parasitic inductive path is larger, the return current 20 flowing into the total parasitic inductive path generates a larger voltage that is transferred to the input. Said in other words, the second terminal end TE2 needs to be physically connected as closely as possible to the reference terminal S in order to eventually reduce the distance dm to zero and the first terminal end TE1 and the second terminal end TE2 needs to be arranged as close as possible to each other at the same lateral side LS of the integrated matching circuit in order to eventually reduce as much as possible the influence of the return current RD. The impedance matching circuit shown in FIG. 1b is particularly suitable for matching the output impedance of high frequency high power amplifier transistors. High frequency high power amplifier transistors used for example in cellular base station amplifiers need to amplify signal up to a range of tens of watts. Depending on a cellular network standard used and on a spatial coverage needed, output powers generated by such high frequency high power amplifier transistors may reach values exceeding 100 W (or 50 dBm). In order to handle such high output powers, the high frequency high power amplifier transistor needs to be carefully designed to be capable to operate at high currents and voltages. The high frequency high power amplifier transistor is thus typically a large transistor with a large output terminal area designed to handle a large amount of current flowing from the output terminal D to a load impedance. The large output terminal area of the high frequency high power amplifier transistor ensures also more efficient power dissipation. Therefore the high frequency high power amplifier transistor has typically an output impedance characterized by a low output resistance and a large negative reactance (i.e. a capacitive impedance). This large negative reactance is schematically shown in FIG. 1b by a parasitic output capacitance Cout connected between the output terminal D and the reference terminal S of the high frequency amplifier transistor 12. In order to match the output impedance of the high frequency high power amplifier transistor 12 with for example the load impedance, an output matching circuit that compensates for the large negative reactance is needed. The integrated matching circuit shown in FIG. 1b which includes the inductive element IND and the capacitive element CAP provides a high pass filter configuration that compensates for the large negative reactance of the high frequency amplifier transistor 12. As mentioned in the background section, the inductive element IND is a shunt inductor that compensates for the large negative reactance of the high frequency amplifier transistor 12. The capacitive element CAP is a shunt capacitor that needs to block DC currents that may flow through the inductive element IND towards the reference potential GND. Thus the capacitive element CAP is not functional to the integrated impedance matching circuit but it is only used as a DC-blocking element. As a consequence the capacitive element CAP needs to be relative large in order not to affect matching of the integrated impedance matching circuit at the high frequency of interest. The series arrangement of the inductive element IND with the capacitive element CAP may be considered a pre-matching stage for the high frequency amplifier transistor 12 in which the large negative reactance is compensated. A series inductor INDS is connected at one side to the first terminal end TE1 and another side to a signal output terminal Output. The series inductor INDS may be part of the pre-matching stage and may be used in combination with the inductive element IND and capacitive element CAP to provide a flat output impedance in the high frequency range of interest (i.e. the operating frequency band of the pre-matching stage). After the pre-matching stage, one or more successive matching stages may be used. Each one of the successive matching stages may be configured as a low pass filter configuration having a series inductive element and a shunt capacitive element respectively. Impedance levels are lower at the pre-matching stage than at the successive matching stages so that power levels and current levels are higher at the pre-matching stage than at the successive matching stages. As a consequence the solution proposed by the inventor prevents that a large feedback voltage across the parasitic inductive element 15 is generated by the large return current RD flowing in the pre-matching stage of the output matching circuit. The disclosed integrated matching circuit may alternatively be used at the input terminal G of the high frequency amplifier transistor 12. In this last case the first terminal end TE1 of the series arrangement of the inductive element IND with the capacitive element CAP is connected to the input terminal G. Similar argumentations to the ones already given in describing FIG. 1b are valid for this latter case wherein the series arrangement of the inductive element IND with the capacitive element CAP is used to compensate for the large negative reactance of the high frequency amplifier transistor 12 present at the input terminal G. As a consequence the integrated matching circuit may be used for example to match an impedance of a previous high frequency amplifier transistor stage to the impedance of the high frequency amplifier transistor 12. This function is normally implemented with a so-called inter-stage impedance matching circuit.

Figure 2A:
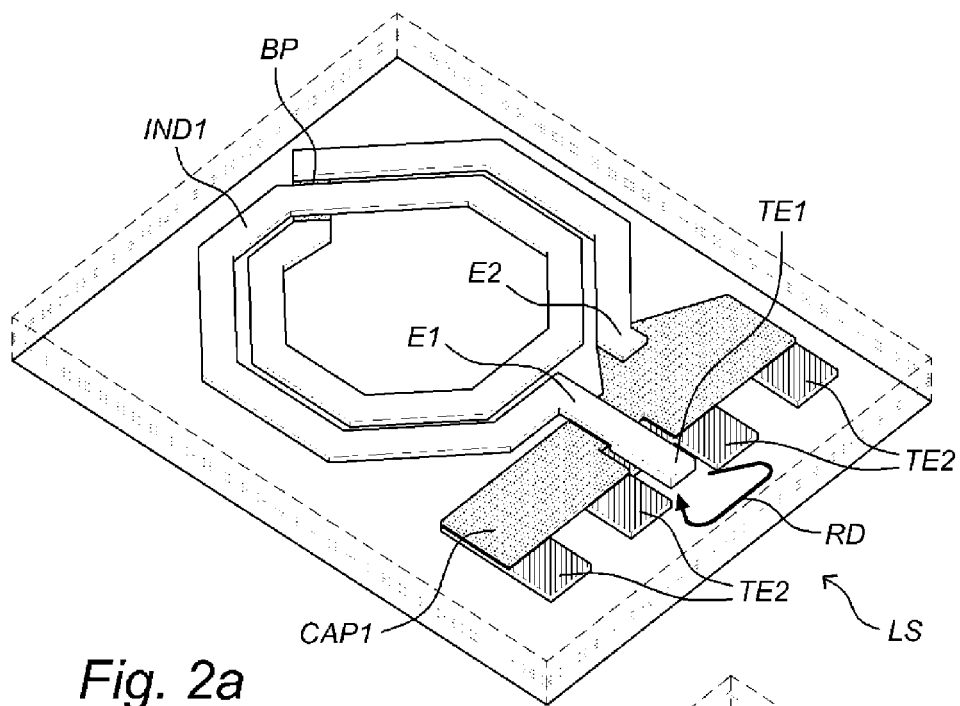
FIG. 2a shows an example of a practical layout embodiment of an impedance matching circuit according to the invention.

FIG. 2a shows a practical layout embodiment of the integrated matching circuit. FIG. 2a shows an integrated matching circuit which includes a series arrangement of an inductive element IND1 with a capacitive element CAP1. The inductive element IND1 has a planar conductive structure with a first end E1 arranged at the first terminal end TE1 of the series arrangement and a second end E2 connected to a first plate of the capacitive element CAP1. A second plate of the capacitive element CAP1 is connected to the second terminal end TE2. The first plate and the second plate of the capacitive element CAP1 may be made of metal as shown in FIG. 2a. In this case the first plate is located in a metal layer different from the metal layer where the second plate is located. Alternatively the first and second plates of the capacitive element CAP1 may be made of other suitable conductive semiconductor materials. In this last case the capacitive element CAP1 is integrated in an active semiconductor area where the high frequency amplifier transistor 12 is also integrated. Another option is to have a metal plate of the capacitive element CAP1 in one layer of the stack of metal layers and another plate in a suitable conductive semiconductor material of the active semiconductor area. A dielectric as for example silicon nitride ($Si_3N_4$) is used between the two metal plates, the two suitable conductive semiconductor material plates or the metal-suitable conductive semiconductor material plates. The planar conductive structure of the inductive element IND1 may be located in a metal layer above the active semiconductor area in which the high frequency amplifier transistor 12 is integrated. The metal layer may be part of a stack of metal layers used to connect the input, output and reference terminals G, D and S of the high frequency amplifier transistor 12 to correspondent contact terminals. The metal layer may be a thick metal layer to reduce DC resistance of the inductive element IND1. The thick metal layer may be made by connecting more metal layers of the stack of layers in parallel through for example vias. The inductive element IND1 of FIG. 2a has a planar spiral structure. The planar spiral structure increases a so-called quality factor of the inductive element IND1 which is a measure of the quality of the inductive element IND1 over the high frequency range of interest. The planar inductive structure increases an inductance value of the inductive element IND1 per unit area so that the inductive element IND1 is more compact for the same inductance value. By having a planar conductive structure a distance between the planar conductive structure and a semiconductor substrate of the semiconductor material underneath is maximized. Consequently the planar conductive structure reduces a parasitic capacitance formed between the planar conductive structure and the semiconductor material underneath through which parasitic currents at the high frequency of interest may flow. The semiconductor substrate underneath the integrated matching circuit may preferably be a high-resistivity substrate which further decreases the amount of said parasitic currents, thereby increasing further the quality factor of the inductive element IND1. The inductive element IND1 shown in FIG. 2a is a planar spiral structure with two turns. More or less turns may be used to increase or decrease the inductance of the inductive element IND1 in order to achieve the desired inductance value. The two turns of the planar conductive structure are connected almost entirely in the same metal layer except for a short by-pass point BP in a different metal layer. This planar conductive structure ensures that the turns of the inductive element IND1 are further apart. The effect of having this planar conductive structure is to increase a distance between portions of the planar conductive structure carrying a current of opposed direction, thereby decreasing a negative mutual inductance between said portions and increasing the effective inductance of the inductive element per unit length of the inductive element IND1. The planar conductive structure of FIG. 2a ensures that the first terminal end TE1 and the second terminal TE2 are arranged at the same lateral side LS of the integrated matching circuit, thus minimizing the return current RD from the output terminal D to the reference terminal S of the high frequency amplifier transistor 12. The return current RD is schematically shown in FIG. 2a by a solid arrow line. It should be noted that in the practical layout embodiment of FIG. 2a the first terminal E1 and the second terminal E2 of the inductive element IND1 are arranged at a distance from the respective first terminal end TE1 and the first plate of the capacitive element CAP1 that is lower than 20% than a total length of the conductive planar spiral structure forming the inductive element IND1. This further ensures that no extra parasitic inductive paths are present between the first end E1 and the first terminal end TE1 and between the second end E2 and the first plate of the capacitive element CAP1.

Figure 2B:
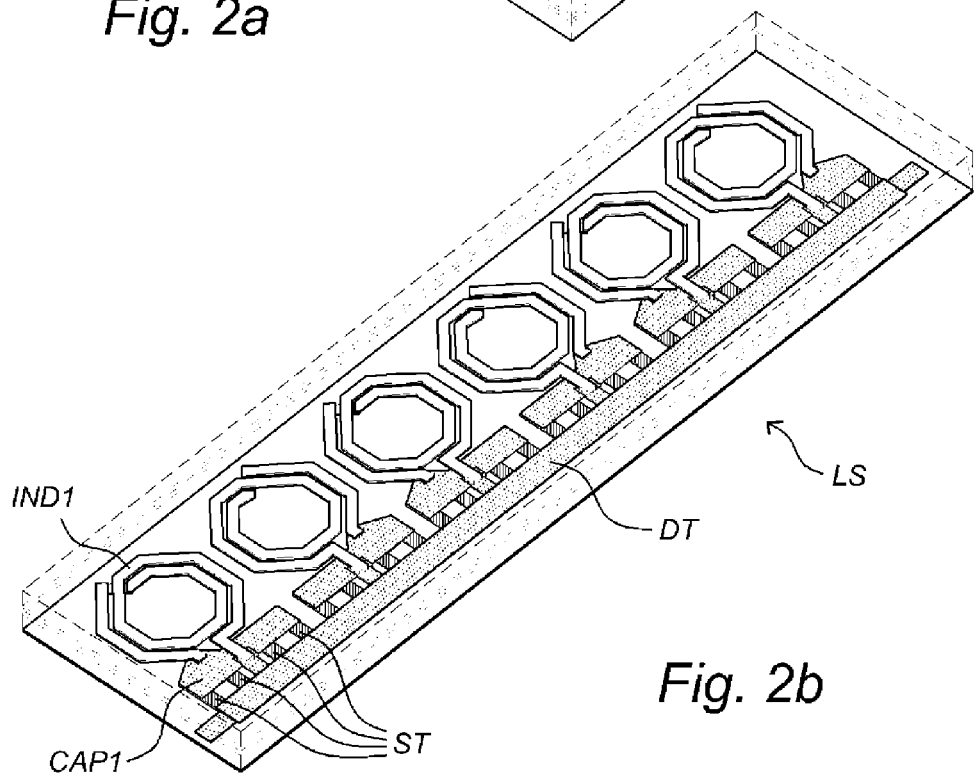
FIG. 2b shows an example of the practical layout embodiment of FIG. 2a implemented in a high frequency amplifier transistor.

FIG. 2b shows a practical layout implementation of the same integrated matching circuit shown in FIG. 2a in a high frequency amplifier transistor. In FIG. 2b a parallel arrangement of a plurality of series arrangements each comprising an inductive element IND1 and a capacitive element CAP1 is shown. The plurality of the series arrangements are arranged in a line extending along a common output contact terminal DT of the high frequency amplifier transistor 12. The plurality of the series arrangements is connected together at the same first terminal end TE1 and at the same second terminal end TE2 of each series arrangement of the plurality. The first terminal end TE1 is connected to the common output contact terminal DT which may be a drain contact terminal in case of a MOS high frequency amplifier transistor. The second terminal end TE2 taps a portion of the parasitic inductive path present between a common reference contact terminal ST of the high frequency amplifier transistor 12 and the ground potential GND. The second terminal end TE2 may be directly connected to the reference terminal S of the high frequency amplifier transistor 12. The reference terminal S is contacted to the common reference contact terminal ST by for example contact vias or contact metal. A sufficient number of contact vias and a sufficient width of the contact metal needs to guarantee a short parasitic inductive path with low inductance between the reference terminal S and the common reference contact terminal ST. The common reference contact terminal ST contacts the second terminal end TE2 of each of the series arrangements of the plurality of series arrangement. It is clear from FIG. 2b that the first terminal end TE1 and the second terminal TE2 of the plurality of the series arrangements are all arranged at the same lateral side LS of the integrated matching circuit providing a reduced distributed return current RD. The solution given in FIG. 2b provides a compact integrated matching circuit in which the undesired output to input feedback between the output terminal D and the reference terminal S is localized in a compact area and thus minimized. It should be also noted that the integrated matching circuit shown in FIG. 2b is highly symmetric thus preventing an unbalance of distributed currents and voltages through parasitic elements that may be present between the inductive element IND1 and the capacitive element CAP1 and between said elements and other parts of the integrated matching circuit or the high frequency amplifier transistor 12. By preventing said unbalance of the distributed currents and voltages, the integrated matching circuit is more reproducible in a manufacturing phase and more predictable in the operation phase.

FIG. 3a shows another practical layout implementation of the disclosed integrated matching circuit. In this practical implementation an inductive element IND2 is arranged in series with a capacitive element CAP2. Similarly to FIG. 2a the inductive element IND2 has a planar spiral conductive structure. In this practical layout implementation of the integrated matching circuit, the first end E1 of the inductive element IND2 is arranged at the first terminal end TE1 of the series arrangement. The second end E2 of the inductive element IND2 is located at an opposite lateral side of the first mentioned lateral side LS where the first end E1 is arranged. The second end E2 is connected to the first plate of the capacitive element CAP2. The second plate of the capacitive element CAP2 is connected by means of at least one bond wire BW to the second terminal end TE2. The at least one bond wire BW tunes the inductive element IND2 to the desired value. The inductive element IND2 is an integrated lumped element that cannot be externally tuned. The at least a bond wire BW provides a flexible way of tuning externally the inductive element IND2 without manufacturing a new inductive element IND2 with a different shape. It is indeed well known in the art that by changing the length, the shape and the diameter of a bond wire, a correspondent inductance of the bond wire may be also changed. As shown in FIG. 3a more than one bond wire BW may be used to tune the inductive element IND2 to the desired inductance value.

FIG. 3b shows an alternative practical layout implementation of the integrated matching circuit. In this alternative practical layout implementation an inductive element IND3 is arranged in series arrangement with a capacitive element CAP3. The first end E1 of the inductive element IND3 is connected to the first terminal end TE1 of the series arrangement by means of at least a bond wire BW. A first plate of the capacitive element CAP3 is connected to the second end E2 of the inductive element IND3. A second plate of the capacitive element CAP3 is arranged at the second terminal end TE2 of the series arrangement. In this practical layout implementation the first plate of the capacitive element CAP3, the inductive element IND3 are connected together in a same top metal layer. The inductive element IND3 has in this case a shape different than a planar spiral conductive structure. This structure may be used to decrease an overall (positive and negative) mutual inductance and increase a self-inductance of the conductive planar structure. The at least one bond wire BW tunes the value of the inductive element as described for the practical layout implementation of FIG. 3a.

FIG. 3c shows an example of the practical layout implementation of FIG. 3a implemented in a high frequency power amplifier. Similarly to FIG. 2b a plurality of series arrangements as depicted in FIG. 3a are connected in parallel between the common output contact terminal DT and common reference contact terminal ST of the high frequency amplifier transistor 12. Similar arguments given for FIG. 2b are also valid for this practical layout implementation. In this case each of the capacitive elements CAP2 in the plurality of the series arrangements shares the same second plate. In fact each all the second plates in the plurality of the series arrangements are interconnected in a top metal layer.

Figure 4A:
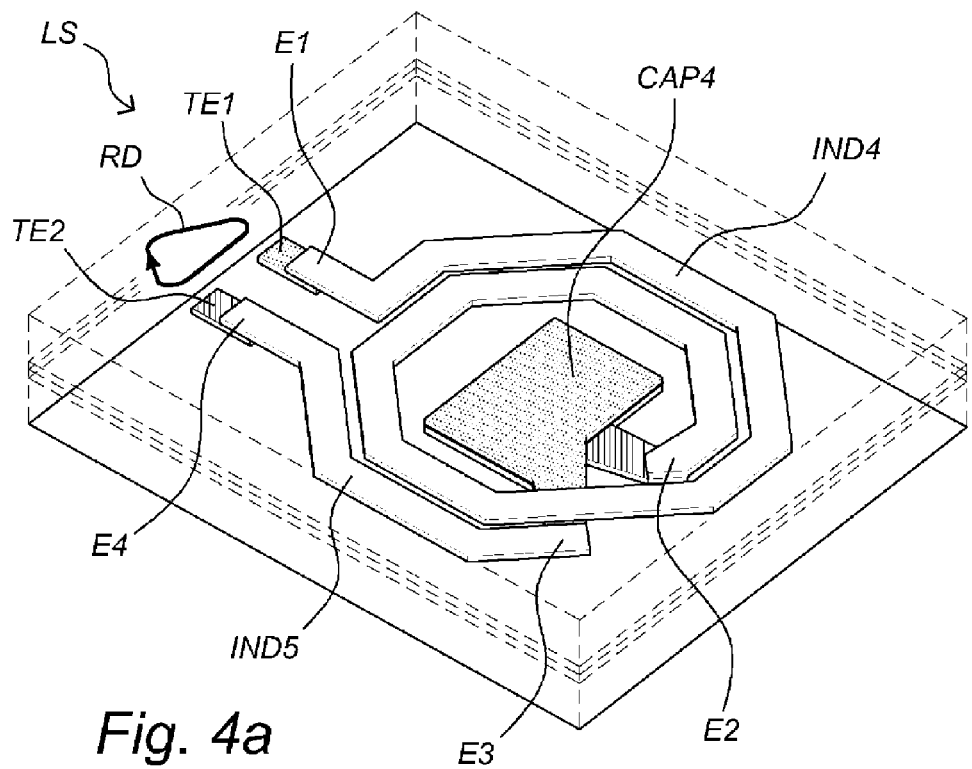
FIG. 4a shows a further example of an embodiment of an impedance matching circuit according to the invention.

FIG. 4a shows an example of an additional practical layout implementation of the integrated matching circuit. In this example the integrated matching circuit includes an inductive element IND4 and a further inductive element IND5 having both a planar conductive structure. The inductive element IND4 has a first end E1 and a second end E2. The further inductive element IND5 has a third end E3 and a fourth end E4. The first end E1 is arranged at the first terminal end TE1 of the series arrangement and the fourth end E4 is arranged at the second terminal end TE2 of the series arrangement. The second end E2 is connected to a first plate of a capacitive element CAP4 and the third end E3 is connected to a second plate of the capacitive element CAP4. The capacitive element CAP4 is arranged in a center area of the planar conductive structure formed by the inductive element IND4 and the further inductive element IND5. This practical layout implementation uses the capacitive element CAP4 as a by-pass element for the planar conductive structure formed by the inductive element IND4 and the further inductive element IND5. In other words the planar conductive structure formed by the inductive element IND4 and the further inductive element IND5 acts as a single inductive element. This practical layout implementation is more compact because the centre area of the planar conductive structure formed by the inductive element IND4 and the further inductive element IND5 is used to integrate the capacitive element CAP4. This practical layout implementation may save considerable layout area in the implementation of the integrated matching circuit. Moreover similarly to the layout implementation of FIG. 2a, the practical layout implementation of the inductive elements IND4 and IND5 in a top metal layer in series with the capacitive element CAP4 with the first and second plates integrated in metal layers different from the top metal layer, decreases the negative mutual inductance of the inductive elements IND4 and IND5 turns and increases the net inductance of the planar conductive structure. The inductive elements IND4 and IND5 may together form a planar conductive spiral structure similar to the one shown in FIGS. 2a and 3a.

Figure 4B:
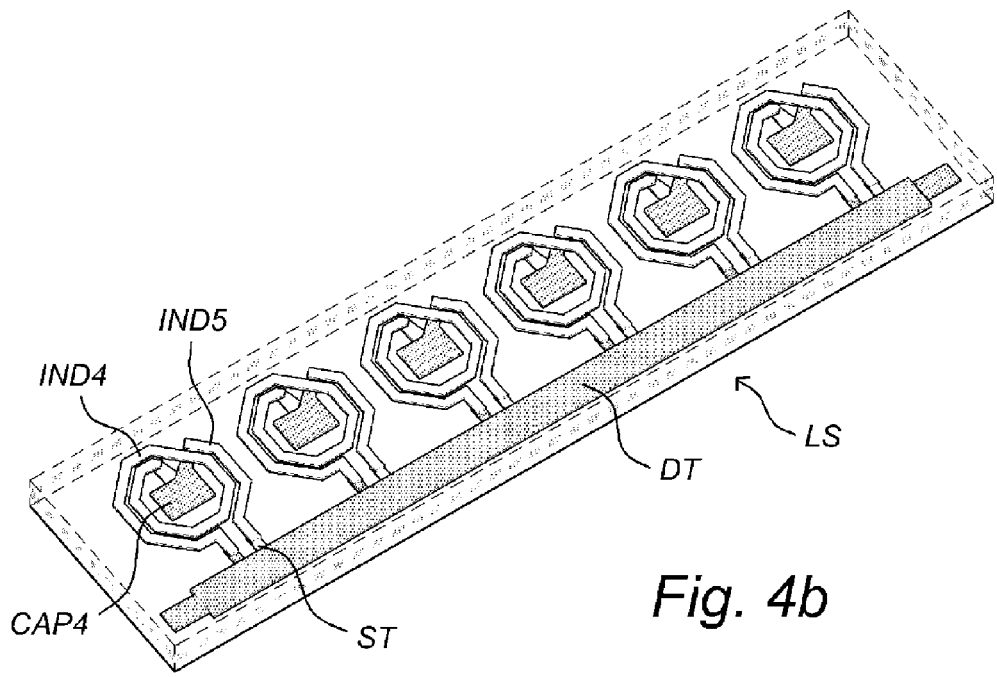
FIG. 4b shows an example of the embodiment of FIG. 4a implemented in a high frequency power amplifier.

FIG. 4b shows an example of a practical layout implementation of the integrated matching circuit presented in FIG. 4a for a high frequency power amplifier. FIG. 4b shows the integrated matching circuit of FIG. 4a repeated several times in a parallel arrangement and arranged in a line extending along the common output and reference contact terminals DT and ST of the high frequency amplifier transistor 12. In this line arrangement it is clearly shown how the practical layout implementation of FIG. 4a may save area in the overall layout implementation for the high frequency amplifier transistor 12. The area used for the integration of the inductive elements IND4 and IND5 is effectively also used for the integration of the capacitive element CAP4.

It should be also note that the same arguments given for the examples of FIG. 2a and FIG. 2b are also valid for the examples of FIG. 3a to FIG. 4b. The type and composition material used for the integration of the inductive and capacitive elements may be of the same type to the type mentioned in describing FIG. 2a. The integrated matching circuits described in FIG. 3a, FIG. 3b and FIG. 4a may alternatively be used at the input of the high frequency amplifier transistor 12. In this last case the terminal end TE1 of the any of the mentioned series arrangement is connected to the input terminal G instead than to the output terminal D.

Figure 5A:
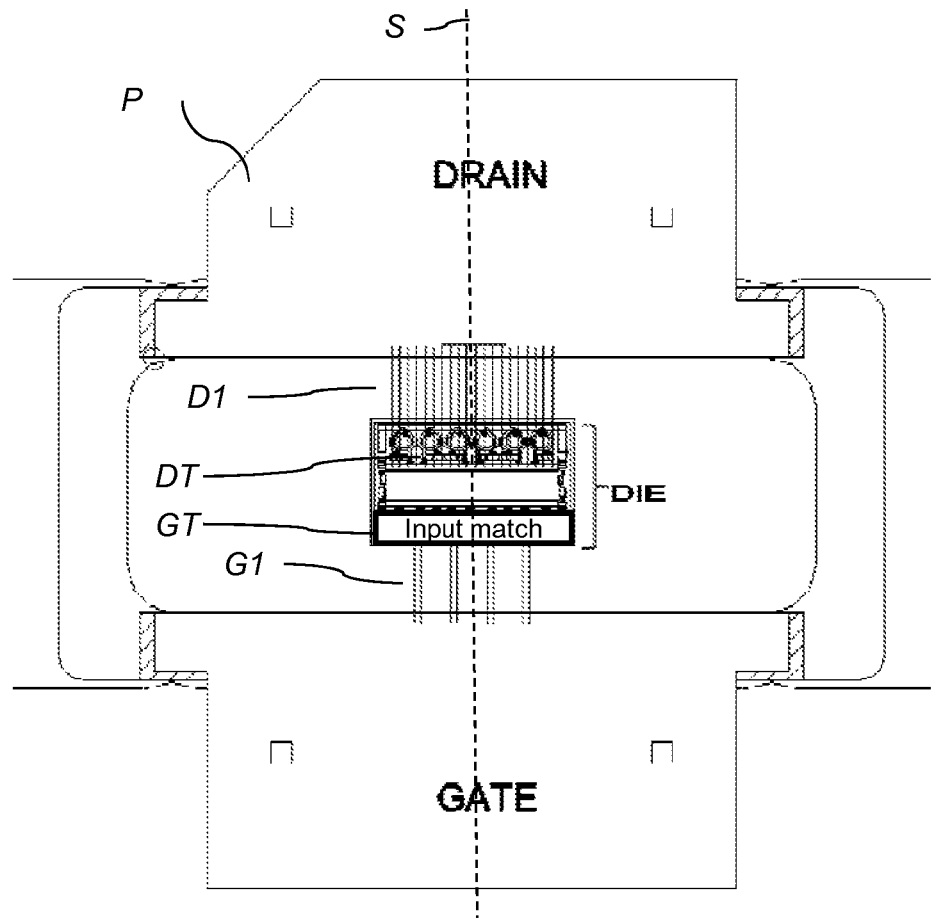
FIG. 5a shows a top view of a high frequency amplifier using the disclosed integrated matching circuit.
Figure 5B:
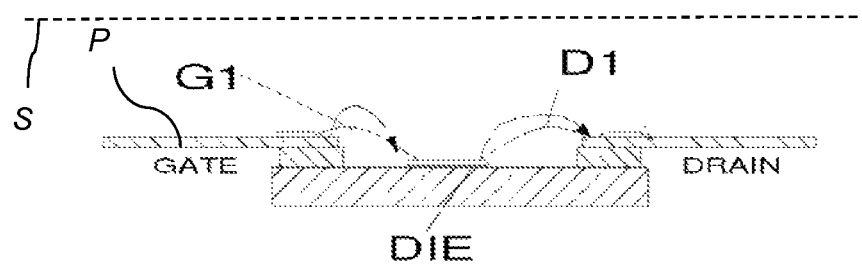
FIG. 5b shows a cross section of the high power amplifier of FIG. 5a, and FIG. 6 shows some experimental results achieved by implementing the practical layout embodiments described in FIG. 2a and FIG. 2b.

FIG. 5a and FIG. 5b show a top view and a cross section along the plane S, respectively, of a complete high frequency amplifier that includes any of the integrated matching circuits with the high frequency amplifier transistor 12 previously described. The high frequency amplifier transistor may be a MOS device with an input contact terminal GT and an output contact terminal DT. The high frequency amplifier transistor together with any of the previously disclosed integrated matching circuits are arranged in a line extending along the input contact terminal GT and along the output contact terminal DT of the high frequency amplifier transistor in a single die DIE. Any of the previously disclosed integrated matching circuits may be used as a part of the output matching circuit at the output contact terminal DT or as part of the input matching circuit at input contact terminal GT. The input contact terminal GT and the output contact terminal DT of the single die DIE are connected to a lead frame package P. The input contact terminal GT is connected to an input terminal GATE of the lead frame package P by means of bond wires G1 and the output contact terminal DT is connected to an output terminal DRAIN of the lead frame package P by means of bond wires D1. By implementing the integrated matching circuits at one of the input and output contact terminals GT and DT in a single die DIE, a design of the high frequency amplifier may be considerably simplified. The design of the high frequency amplifier is more compact and does not necessitate of any other external discrete matching components.

In another exemplary embodiment the high frequency amplifier includes a further high frequency amplifier transistor. The high frequency amplifier transistor and the further high frequency amplifier transistor may be placed in one same package as schematically shown in FIG. 5a and FIG. 5b. The high frequency amplifier transistor and the further high frequency amplifier transistor may be LDMOS devices. Each of the high frequency amplifier transistors may be integrated with a correspondent integrated matching circuit in a single DIE as shown in FIG. 5a and FIG. 5b. The correspondent integrated matching circuit may be part of one of the input impedance matching circuit or of the output matching circuit of each of the high frequency amplifier transistors. The high frequency amplifier transistor and the further high frequency amplifier transistor may be arranged in a Doherty amplifier configuration. The Doherty amplifier configuration is well known in the art and it is typically used for high frequency power amplifiers. The Doherty amplifier configuration uses two high frequency amplifier transistors operating at different regimes in order to optimize an overall efficiency of the high frequency power amplifier. The Doherty amplifier configuration requires that the two high frequency amplifier transistors operate as independent units without cross-coupling. In particular a cross-coupling involving a common parasitic inductive path connecting the reference terminals of both the high frequency amplifier transistor and the further high frequency amplifier transistor may be particularly dangerous for stability and efficiency degradation. When the Doherty amplifier is build based on two high frequency amplifier transistors with any of the previously discussed integrated matching circuit that share the same transistor package (e.g. similar to the package P shown in FIG. 5a, 5b) each of the high frequency amplifier transistors acts as an isolated high frequency amplifier transistor. As previously discussed, this may be achieved if in each of the high frequency amplifier transistors the first terminal end TE1 and the second terminal end TE2 is close to each other and if a geometry in which the distance dm between the second terminal end TE2 and the reference terminal S is minimized. In such case the return current RD is isolated in each of the high frequency amplifier transistors and a feedback through the common parasitic inductive path is minimized. Furthermore when the output to input series feedback via the common parasitic inductive path is strong, the input impedance of each of the high frequency amplifier transistors may change as a function of the input power levels applied to the input contact terminal GT of the high frequency amplifier transistor. As a consequence it becomes difficult to match the input impedance of the high frequency amplifier transistor for a range of frequencies that is bigger than 10% than the high frequency of interest without sacrificing the gain of the Doherty amplifier configuration. By reducing as explained the common parasitic inductive path between the two high frequency amplifier transistors, the isolation between the input terminal G and the output terminal D is improved and a broader band performance of the Doherty amplifier configuration may be achieved, i.e. within more than 10% bandwidth. It should be noted that the high frequency of interest depends on the application in which the high frequency amplifier or the Doherty amplifier configuration is used. The high frequency of interest may be the operating frequency of wireless communication systems such as for example GSM, EDGE, WCDMA, LTE, etc.

Figure 6:
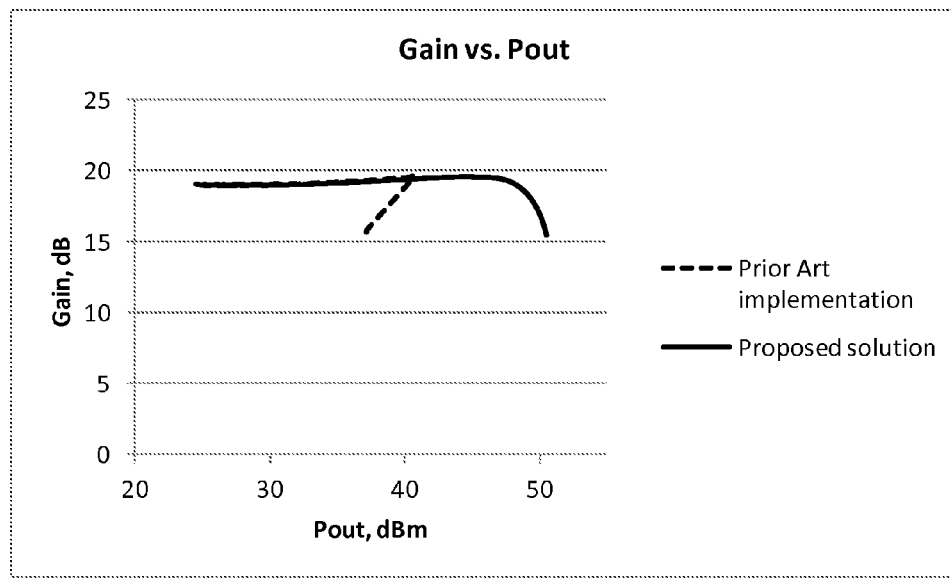

As an example of what has just been said, we report in FIG. 6 a measurement result of a gain of a high frequency power amplifier transistor versus output power levels. The dashed line indicates the performance reached by a typical prior art solution with discrete external matching components and the solid line indicates the performance achieved by the integrated matching circuit described in FIG. 2a and FIG. 2b. It can be see that no degradation of the gain or oscillation is observed for output power levels up to almost 50 dBm (100 W). The gain shown in FIG. 6 is in a range of 18-20 dB in a range of output powers of 25-47 dBm.

A semiconductor device may include the high frequency amplifier so far described. The semiconductor device may include a package (e.g. similar to the package P shown in FIG. 3) in which the high frequency amplifier transistor or the high frequency amplifier transistors are mounted.

Any of the previously discussed high frequency amplifier or semiconductor devices may be implemented in a base station for mobile communications such as 3G or 4G mobile communications standards in which high efficiency radio frequency power amplifiers are required.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Other modifications, variations and alternatives are also possible. The specifications and drawings are, accordingly, to be regarded in an illustrative rather than in a restrictive sense. In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that an arrangement of these measures cannot be used to advantage.

What is claimed is:

1. An integrated matching circuit for a high frequency amplifier transistor having an input terminal, an output terminal and a reference terminal configured to be coupled to a reference potential, the integrated matching circuit comprising:
   a substrate;
   an inductive element coupled to the substrate and having a first end and a second end; and
   a capacitive element coupled to the substrate, wherein the capacitive element is arranged in a series arrangement with the inductive element such that the capacitor is coupled between the second end of the inductive element and the reference terminal, the series arrangement having a first terminal end connected to the input terminal or to the output terminal and a second terminal end connected to the reference terminal, the first terminal end and the second terminal end being arranged at a same lateral side of the integrated matching circuit to obtain a geometry with the first terminal end adjacent to the input terminal or to the output terminal and the second terminal end adjacent to the reference terminal, and wherein the first terminal end and the second terminal end are directly adjacent to each other across a portion of the substrate.

2. The integrated matching circuit as claimed in claim 1 wherein the inductive element has a planar conductive structure with the first end and the second end, the first end being arranged at the first terminal end and the second end being connected to a first plate of the capacitive element, the capacitive element having a second plate connected the second terminal end.

3. The integrated matching circuit as claimed in claim 2 wherein the second plate of the capacitive element is connected to the second terminal end with at least a bondwire.

4. The integrated matching circuit as claimed in claim 2 wherein the first end of the inductive element is connected to the first terminal end with at least a bondwire.

5. The integrated matching circuit according to claim 2 wherein the planar conductive structure of the inductive element is a planar spiral structure.

6. The integrated matching circuit as claimed in claim 1 wherein the inductive element has a planar conductive structure with the first end and the second end, the first end being arranged at the first terminal end and the second end being connected to a first plate of the capacitive element, the capacitive element having a second plate connected the second terminal end, and wherein the first terminal and the second terminal of the inductive element are arranged at a distance from the respective first terminal end and the first plate of the capacitive element lower than 20% than a total length of the conductive planar spiral structure forming the inductive element.

7. The integrated matching circuit according to claim 1 wherein a parallel arrangement of a plurality of the series arrangements is arranged in a line extending along an input contact terminal or an output contact terminal of the high frequency amplifier transistor and wherein the plurality of the series arrangements is connected together at the same first terminal end of each of the series arrangement to the same input contact terminal or the same output contact terminal of the high frequency amplifier transistor and at the same second terminal end of each of the series arrangement to a same reference contact terminal of the high frequency amplifier transistor.

8. A device comprising:
a substrate;
a reference terminal coupled to the substrate;
a contact terminal coupled to the substrate; and
a first integrated matching circuit coupled to the substrate, wherein the first integrated matching circuit includes a series arrangement that includes a first terminal end connected to the contact terminal, a second terminal end connected to the reference terminal, an inductive element connected to the first terminal end, and a capacitor connected between the inductive element and the second terminal end,
wherein the first and second terminal ends are directly adjacent to each other across a portion of the substrate.

9. The device of claim 8, wherein the substrate is a semiconductor die, and the device further comprises:
a transistor coupled to the substrate, wherein the transistor has a source terminal and a drain terminal, and wherein the drain terminal is coupled to the contact terminal.

10. The device of claim 9, further comprising:
a plurality of additional integrated matching circuits coupled to the substrate, wherein each of the plurality of additional integrated matching circuits includes an additional series arrangement coupled between the contact terminal and the reference terminal.

11. A high frequency amplifier transistor comprising:
a semiconductor die;
a reference node coupled to the semiconductor die;
a contact terminal coupled to the semiconductor die;
a transistor coupled to the semiconductor die, wherein the transistor has a source terminal and a drain terminal, wherein the source terminal is coupled to the reference node, and wherein the drain terminal is coupled to the contact terminal; and
an integrated matching circuit that includes
a first terminal end coupled to the contact terminal,
a second terminal end coupled to the reference node,
an inductive element coupled to the semiconductor die and having a first end and a second end, wherein the first end is coupled to the first terminal end, and
a capacitive element coupled to the semiconductor die, wherein the capacitive element is coupled between the second end of the inductive element and the second terminal end, and
wherein the first terminal end and the second terminal end are directly adjacent to each other across a portion of the semiconductor die.

12. The high frequency amplifier transistor according to claim 11, further comprising:
a lead frame package in which the semiconductor die is packaged.

13. The high frequency amplifier transistor according to claim 11, wherein the transistor comprises an LDMOS power transistor.

14. The high frequency amplifier transistor according to claim 11, further comprising a further transistor with a correspondent integrated matching circuit wherein the transistor and the further transistor are arranged in a Doherty amplifier configuration.

15. The high frequency amplifier transistor according to claim 11 wherein an operating frequency of the high frequency amplifier transistor is in a radio or microwave frequency range.

16. An integrated matching circuit for a high frequency amplifier transistor having an input terminal, an output terminal, and a reference terminal, the integrated matching circuit comprising:
an inductive element;
a capacitive element arranged in a series arrangement with the inductive element, the series arrangement having a first terminal end connected to the input terminal or to the output terminal and a second terminal end connected to the reference terminal, the first terminal end and the second terminal end being arranged at a same lateral side of the integrated matching circuit to obtain a geometry with the first terminal end adjacent to the input terminal or to the output terminal and the second terminal end adjacent to the reference terminal; and
a further inductive element having a planar conductive structure with a third end and a fourth end, wherein the inductive element has a planar conductive structure with a first end and a second end, the first end and the fourth end being connected to the first terminal end and to the second terminal end respectively, the second end and the third end being connected to a first plate and to a second plate of the capacitive element respectively, the capacitive element being arranged in the centre area of the planar conductive structure formed by the inductive element and the further inductive element.

* * * * *